TRANSISTORIZED DEFLECTION SYSTEM WITH PROTECTIVE MEANS

Filed Oct. 19, 1965

INVENTOR.
PAUL G. WOLFE
BY Fordyce A. Bothwell
ATTORNEY

United States Patent Office 3,396,309
Patented Aug. 6, 1968

3,396,309
TRANSISTORIZED DEFLECTION SYSTEM WITH PROTECTIVE MEANS

Paul G. Wolfe, Oreland, Pa., assignor to Philco-Ford Corporation, Philadelphia, Pa., a corporation of Delaware Filed Oct. 19, 1965, Ser. No. 497,820
8 Claims. (Cl. 317—20)

ABSTRACT OF THE DISCLOSURE

Deflection system with transistor protection means comprising circuit for draining energy from system if peaks of flyback pulses exceed threshold. Circuit may comprise diode connected either to tap on high voltage winding or in series with auxiliary winding of deflection transformer.

This invention relates to transistorized deflection systems such as employed in television receivers, and more particularly to the protection of the output transistor against the build-up of excessive energy in such a system.

Since the invention is particularly well suited for use in the horizontal deflection system of a television receiver, it will be described as applied to such use. As is well known, in the conventional horizontal deflection system each line scanning cycle comprises a trace interval and a retrace or flyback interval which is short in relation to the trace interval, and during each retrace interval a so-called "flyback pulse" is produced. In a transistorized system the output transistor is subject to possible damage or even destruction by a flyback pulse of excessive amplitude. An increase in the amplitude of the flyback pulse may result, for example, from a decrease in the frequency of the horizontal oscillator and consequent increase of the scanning cycle time and increase of the stored energy.

One object of the present invention is to prevent build-up of excessive energy in a transistorized deflection system, thereby to protect the output transistor of such system against damage or destruction.

Another object of the invention is to provide a novel energy drainage circuit to prevent the build-up of excessive energy in such a system.

Another object of the invention is to provide a satisfactory solution of the problem of possible excessive amplitude of a flyback pulse in a transistorized horizontal deflection system.

Still another object of the invention is to provide relatively simple and inexpensive means for the stated purpose.

In accordance with this invention, an energy drainage circuit is provided and is controlled so as to become effective only when the energy in the system tends to increase beyond a predetermined fixed level. Then the drainage circuit serves to remove any further energy and thus protects the output transistor.

*Drawings*

Figures 1, 2:
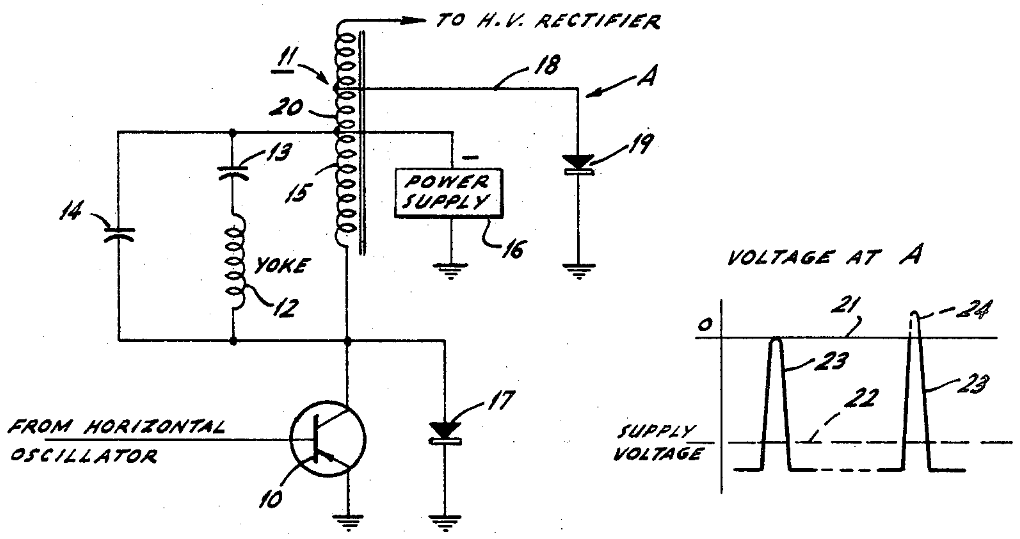
FIG. 1 is a schematic illustration of a horizontal output system for a television receiver or the like embodying one form of the present invention.
FIG. 2 is an illustration of certain voltage relationships which are helpful in understanding the operation of the system of FIG. 1.

*FIGS. 1 and 2*

Referring first to FIG. 1 shows a transistorized horizontal output system for a television receiver or the like which is conventional except for the circuit 18–19. The conventional components of the system comprise an output transistor 10 whose emitter is grounded, an output transformer 11 which is connected to the collector of transistor 10, a deflection yoke 12 and a capacitor 13 connected in series across a winding 15 of said transformer, a capacitor 14 connected in shunt with primary winding 15, a power supply 16 connected to a tap at the upper end of winding 15, and a damper diode 17 connected between the lower end of said winding and ground.

As is well understood, during the retrace portion of each operating cycle a flyback pulse is produced by the energy stored in the system. By rectification of these high voltage pulses, a high D.C. voltage is supplied to the second anode of the cathode ray tube. The problem with which the present invention is particularly concerned is the possible damage or destruction of transistor 10 due to excessive amplitude of the flyback pulses.

In accordance with one embodiment of this invention, an energy drainage circuit 18 including a diode 19 is connected between ground and a tap across section 20 of the high voltage or secondary winding of transformer 11.

The operation of the energy drainage circuit can be clearly understood with the aid of FIG. 2 in which the abscissa line 21 represents the zero potential at ground point to which the cathode of diode 19, is connected, broken line 22 represents the negative power supply voltage, and the heavy line represents the voltage at point A, i.e., the voltage of the heavy line anode of diode 19.

The total time of each scanning cycle, i.e., trace plus retrace times, is determined by the frequency of the horizontal oscillator (not shown) whose output is connected to the base of transistor 10. The retrace or flyback time is determined by the resonant frequency of the circuit. The amplitude of the pulse appearing across primary winding 15 during the flyback interval is approximately equal to the power supply voltage multiplied by the ratio of trace time to flyback or retrace time. Therefore, if the ratio of turns in section 20 of the secondary winding to the number of turns in the primary winding 15 is approximately equal to the ratio of flyback time to trace time, the amplitude of the pulses appearing across section 20 will be equal to the voltage supplied by source 16 so that the pulse 23 will just reach zero at its peak. In practice it has been found that if the number of turns of winding 20 is approximately 12 percent of the number of turns of winding 15, satisfactory operation is obtained.

In normal operation, with the turns ratio above indicated, during each retrace time the voltage at point A will be in a form of a pulse 23 whose peak reaches zero or ground potential. Diode 19 will be non-conductive since the voltage at its anode does not rise above zero or ground potential. In such normal operation the energy stored in the system and hence the voltage to which the transistor 10 is subjected is not sufficient to damage the transistor. However, if during any cycle of operation the stored energy increases as would happen for example if the frequency of the horizontal oscillator were to decrease, then the voltage pulse 23 will tend to rise above the zero level 21 as indicated by the broken line representation 24. As soon as this happens, however, diode 19 conducts and the excess energy is drained off through the drainage circuit 18, thus preventing damage to or destruction of transistor 10.

Figures 3, 4:
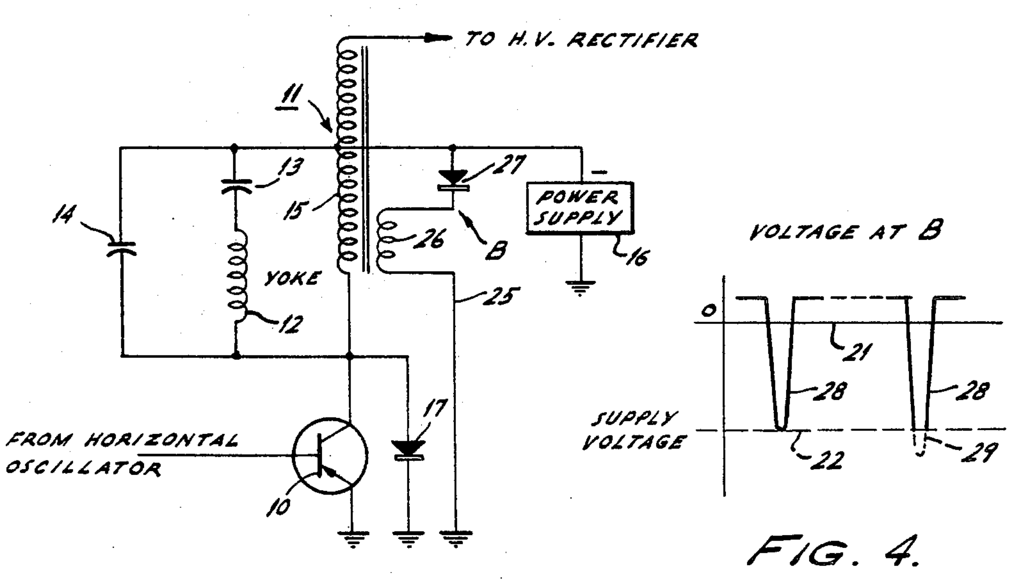
FIG. 3 is a schematic illustration of a horizontal output system embodying another form of the present invention.
FIG. 4 is an illustration of certain voltage relationships which facilitate an understanding of the operation of the system of FIG. 3.

*Figs. 3 and 4*

FIG. 3 shows another embodiment of the invention in which the conventional elements are the same as in FIG. 1 and are again designated by reference numerals 10 to 17. However in this embodiment the energy drainage circuit 25 includes a winding 26 and a diode 27 serially connected between the negative terminal of power supply 16 and ground, with winding 26 being inductively coupled to winding 15. Again the number of turns in winding 26 may be approximately 12 percent of the number of turns in winding 15.

The operation is depicted in FIG. 4 in which the abscissa line 21 again represents zero or ground potential and the broken line 22 represents the power supply voltage. However since in this embodiment the negative power supply voltage is applied to the anode of diode 27, the heavy line represents the voltage at B, i.e. at the upper end of winding 26 and at the cathode of diode 27. During each trace interval this latter voltage is positive and during each retrace interval it pulses in the negative direction and normally peaks at the level of the power supply voltage is shown by the normal pulse 28. The diode 27 is therefore normally non-conductive.

However if during any cycle the stored energy should increase, the negative going pulse 28 will tend to extend beyond the supply voltage level 22 as indicated by the broken line representation 29. As soon as this happens the diode 27 conducts and the excess energy is returned to the power supply, thereby preventing damage or destruction of the transistor 10.

From the foregoing description, it will be seen that this invention provides a simple protective arrangement the operation of which involves a clamping action by which the stored energy is effectively clamped at a fixed level that will not cause damage to the output transistor. With this invention it is possible to employ a less expensive transistor 10 and this offsets, to some extent at least, the cost of utilizing this invention.

In the usual form of deflection system, the yoke and the transformer are distinct elements as in the illustrated embodiments. However, as is known, the yoke itself may serve as a winding of the transformer. In such case the energy drainage circuit of the present invention could be directly associated with the yoke.

While certain embodiments of the invention have been illustrated and described, it will be understood that the invention is not limited thereto but contemplates such modifications and further embodiments as may occur to those skilled in the art.

I claim:

1. A protected transistor amplification stage, comprising:

(a) a transistor, a direct current supply source, and a transformer having a primary winding and at least one secondary winding, the collector-emitter circuit of said transistor being connected in series with said primary winding and said source, one terminal of said secondary winding being connected to one terminal of said source, (b) means for rendering the collector-emitter circuit of said transistor alternately conductive and nonconductive, whereby flyback pulses will be induced in the windings of said transformer when said transistor is rendered nonconductive, and (c) a threshold conduction device connected between the other terminal of said source and a point on said secondary winding at which said flyback pulses have voltage peaks which do not exceed the voltage at said other terminal of said source when said transistor is rendered conductive and nonconductive at a given rate, but which tend to exceed the voltage at said other terminal if said rate decreases, said device being arranged to conduct to limit said voltage peaks by draining energy from said stage back to said source if said voltage peaks tend to exceed the voltage at said other terminal.

2. The stage of claim 1 wherein said transformer is a horizontal output transformer of a television receiver, said (b) means comprises a horizontal oscillator whose output is connected to the base of said transistor, said collector-emitter circuit of said transistor has a damper diode connected thereacross, and a deflection yoke is connected to the collector circuit of said transistor.

3. The stage of claim 2 wherein said secondary winding is a high voltage winding of said transformer which is connected to a second anode of the picture tube of said receiver and wherein said threshold conduction device is a diode which has one terminal connected to a tap on said high voltage winding.

4. The stage of claim 2 wherein said threshold conduction device is a diode which is connected in series with said secondary winding across said source.

5. In a deflection system for a television receiver, the combination comprising:

(a) a horizontal oscillator, (b) a horizontal output amplifier stage comprising a transistor having a base connected to the output of said oscillator, an emitter connected to a first terminal of a direct current bias source, and a collector connected to a second terminal of said source via a primary winding of an output transformer, and (c) a protective circuit comprising a secondary winding of said transformer connected to one of said terminals of said source and a diode connected between the other of said terminals of said source and a point on said secondary winding such that the peak voltage of the flyback pulses induced in said winding do not exceed the voltage at said other terminal of said source unless the energy in said stage tends to exceed a predetermined level, whereupon said peak voltage will forward bias said diode and the excess energy will be drained from said stage back to said source via said diode.

6. The system of claim 5 wherein a damper diode is connected across the collector-emitter circuit of said transistor and a deflection yoke is connected to the collector circuit of said transistor.

7. The system of claim 5 wherein said secondary winding is the high voltage winding of said receiver and said diode is connected to a tap on said winding.

8. The system of claim 5 wherein said secondary winding and said diode are connected in series across said source.

References Cited

UNITED STATES PATENTS

| | | | |
|---|---|---|---|
| 2,959,716 | 11/1960 | Gordon | 317—33 X |
| 2,997,622 | 8/1961 | Claypool | 315—27 |
| 3,030,444 | 4/1962 | Preisig | 315—27 |
| 3,165,668 | 1/1965 | Harpley | 317—33 X |
| 3,235,766 | 2/1966 | Martin et al. | 315—27 |
| 3,287,594 | 11/1966 | Wada | 307—88.5 |
| 3,293,495 | 12/1966 | Smith | 317—33 X |

LEE T. HIX, *Primary Examiner.*

J. D. TRAMMELL, *Assistant Examiner.*